(12) United States Patent
Mehrad et al.

(10) Patent No.: US 7,112,497 B2
(45) Date of Patent: Sep. 26, 2006

(54) MULTI-LAYER REDUCIBLE SIDEWALL PROCESS

(75) Inventors: Freidoon Mehrad, Plano, TX (US); Vivian Liu, Garland, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/877,153

(22) Filed: Jun. 25, 2004

(65) Prior Publication Data

US 2005/0287751 A1 Dec. 29, 2005

(51) Int. Cl.
*H01L 21/336* (2006.01)

(52) U.S. Cl. .............. 438/303; 438/305; 257/E21.626

(58) Field of Classification Search .............. 438/142, 438/197, 199–203, 210–233, 275–308, 585–591
See application file for complete search history.

(56) References Cited

U.S. PATENT DOCUMENTS

| | | | |
|---|---|---|---|
| 5,573,965 A * | 11/1996 | Chen et al. | 438/297 |
| 6,455,362 B1 | 9/2002 | Tran et al. | |
| 6,881,616 B1 * | 4/2005 | Hellig et al. | 438/181 |
| 6,930,007 B1 * | 8/2005 | Bu et al. | 438/289 |
| 2002/0192868 A1 | 12/2002 | Kim | |
| 2005/0026380 A1 * | 2/2005 | Kammler et al. | 438/305 |

OTHER PUBLICATIONS

U.S. Appl. No. 10/383,090, filed Mar. 6, 2003, Mehrad et al.

* cited by examiner

*Primary Examiner*—Brook Kebede
(74) *Attorney, Agent, or Firm*—Jacqueline J. Garner; W. James Brady, III; Frederick J. Telecky, Jr.

(57) ABSTRACT

The present invention pertains to a multi-layer sidewall process (100) that facilitates forming a transistor in a manner that allows adherence to certain design rules while concurrently mitigating adverse effects associated with forming areas of transistors close to one another. First sidewall spacers having first widths are formed (124) alongside a gate structure of a transistor to facilitate implanting source/drain dopants far enough away from the gate structure so that dopant atoms are unlikely to migrate into a channel area under the gate structure. Additionally, the process provides uniform layers for dopant atoms to pass through to mitigate variations in device characteristics across a wafer. The manner of forming the sidewall spacers also allows a salicide blocking process to be simplified. The first sidewall spacers are subsequently reduced (132) to establish second sidewall spacers having second widths which are smaller than the first widths. The smaller second sidewall spacers facilitate compliance with design rules by allowing source and drain contacts to be formed closer to the gate structure.

15 Claims, 8 Drawing Sheets

MULTI-LAYER REDUCIBLE SIDEWALL PROCESS

FIELD OF INVENTION

The present invention relates generally to semiconductor processing, and more particularly to fabricating a transistor with a multi-layer reducible sidewall process that facilitates scaling.

BACKGROUND OF THE INVENTION

Several trends presently exist in the semiconductor device fabrication industry and in the electronics industry. Devices are continually getting smaller, faster and requiring less power, while simultaneously being able to support a greater number of increasingly complex and sophisticated applications. One reason for these trends is that there is an ever increasing demand for small, portable and multifunctional electronic devices. For example, cellular phones, personal computing devices, and personal sound systems are devices which are in great demand in the consumer market. These devices rely on one or more small batteries, which are generally rechargeable, as a power source and also require an ever increasing computational and storage capacity to store and process data, such as digital audio, digital video, contact information, database data and the like. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer, for example.

The process of manufacturing integrated circuits typically consists of more than a hundred steps, during which hundreds or thousands of copies of an integrated circuit can be formed on a single wafer. Throughout the process, the wafer has layer after layer of material applied thereto and treated in some fashion to create electrically active regions in and on the semiconductor wafer surface. In MOS transistors, for example, a gate structure containing one or more conductive materials is created from one or more layers, and this gate structure can be energized by applying a voltage thereto to establish an electric field within a semiconductor channel, by which current is enabled to flow between a source region and a drain region on either side of the channel. The source and drain regions facilitate this conductance by virtue of containing a majority of positive (p-type) or negative (n-type) dopant atoms.

Dopant atoms are implanted into the source and drain regions to establish the n or p type regions. It can be appreciated that dopant atoms may, at times, have to be implanted through one or more layers of material to establish the source and drain regions, and that the composition of such layers may slow down or otherwise affect the trajectory of the dopant atoms. Accordingly, if the layers are not substantially uniform, the implanted areas may differ across the wafer resulting in devices having different operating characteristics. Thus, it would be desirable to have substantially uniform layers where dopant atoms are implanted through the layers. However, with conventional processing, and in particular processing to form sidewall spacers adjacent to gate structures, layers are often damaged or otherwise made non-uniform by some of the steps within the process. Such sidewall spacers serve to direct dopant atoms into certain 'implant' regions within the substrate and are formed, in part, by etching a layer of material overlying the gate structures. The etchant utilized, however, can also etch or 'eat away' some of the layer(s) adjacent to the gate structures, making them non-uniform and thus adversely affecting the implantation process. Thus, it would be desirable to form sidewall spacers while maintaining the uniformity of adjacent layers.

Also, patterning or otherwise processing some layers in conventional manners can lead to undesirable channeling that can short out conductive areas, such as electrical contacts for source and drain regions, for example. Such channeling is more prone to occur between features that are formed very close to one another, such as between sidewall spacers that are continually formed closer to one another as scaling continues. By way of example, a relatively thin layer of oxide material that overlies gate structures, sidewall spacers and other areas of the wafer may be non-uniform due to limitations associated with tools available and/or process variations. Accordingly, such a layer may have to be etched, stripped or otherwise removed from the wafer. Doing so, however, may cause a small channel to be formed in an underlying layer (e.g., a shallow trench isolation (STI) layer) that electrically isolates two or more conductive areas from one another. The channel can thus electrically couple the conductive areas, particularly where a material, such as tungsten (W), for example, is subsequently applied in the fabrication process. The material can diffuse into the channel and electrically couple and short out the conductive areas. Thus, it would be desirable to establish uniform layers in a manner that does not facilitate shorting out conductive areas.

Additionally, it is at times desirable to protect or 'block off' portions of material from subsequent processing. For example, certain layers of material can be salicided or treated to become (more) electrically conductive and/or to establish areas where electrical contacts of connections can be made. It may, however, be desirable to protect some regions from such treatment(s) so that such regions remain 'resistive' or non-conductive. Conventionally, additional steps are required to isolate or protect such regions from subsequent processing. As with most fabrication processing, however, it is an ongoing desire to simplify the process and reduce the time, material and equipment required to fabricate semiconductor devices. Accordingly, it would be desirable to perform a salicide blocking process in a more efficient manner.

Further, as device sizes continue to shrink, the close proximity of certain areas can lead to undesirable results. With regard to transistors, for example, forming source and drain regions too close to the gate structure can lead to diffusion or migration of source/drain dopants into the channel region under the gate structure, which can in turn lead to skewed threshold voltages, leakage currents, etc., all of which are undesirable. Additionally, certain design rules come into play as scaling occurs. Such design rules set forth maximum and/or minimum allowable values for certain dimensions, for example. One such design rule may, for example, dictate a maximum allowable distance between a gate structure and a source contact. However, satisfying this design rule with conventional fabrication techniques may not be feasible since forming the source region very close to the gate structure may allow source dopants to drift into the channel.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to a multi-layer sidewall process that can be utilized in the formation of a transistor. The process facilitates compliance with certain design rules while concurrently mitigating at least some adverse effects associated with forming areas of transistors close to one another. First sidewall spacers having first widths are formed alongside a gate structure of a transistor to facilitate implanting source/drain dopants far enough away from the gate structure so that dopant atoms are unlikely to migrate into a channel area under the gate structure. The sidewall spacers are formed in a manner that leaves adjacent layers of material substantially uniform so that dopant atom implantation is not adversely affected thereby. The manner of forming the sidewall spacers also allows a salicide blocking process to be performed in a more efficient manner. The first sidewall spacers are subsequently reduced in size to establish second sidewall spacers having second widths which are smaller than the first widths. The smaller second sidewall spacers facilitate compliance with design rules by allowing source and drain contacts to be formed closer to the gate structure.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
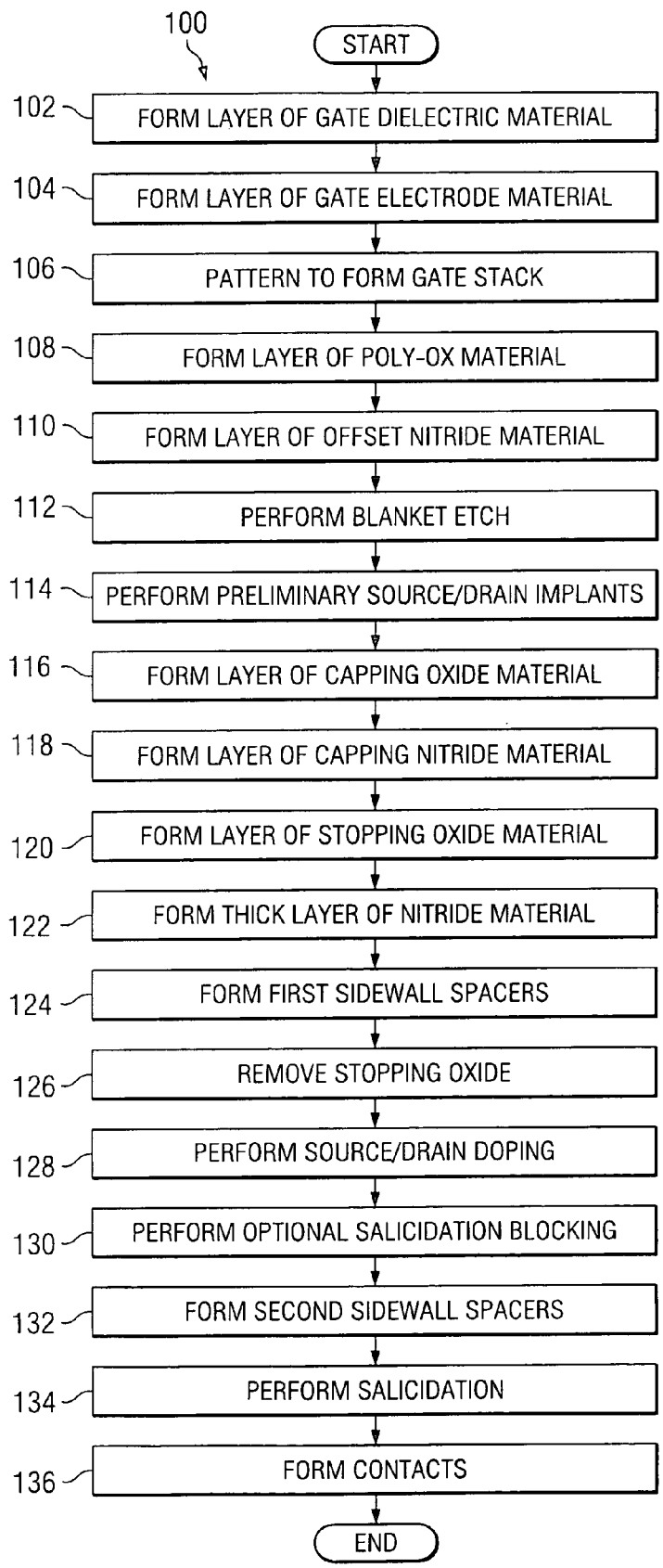
FIG. 1 is a flow diagram illustrating an exemplary methodology for forming a transistor in accordance with one or more aspects of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to a multi-layer sidewall process that may be implemented when forming a MOS transistor, for example. The multi-layer sidewall process facilitates compliance with certain design rules while concurrently mitigating at least some adverse effects associated with forming areas of transistors close to one another. In the process, first sidewall spacers having first widths are formed alongside a gate structure of a transistor to facilitate implanting source/drain dopants far enough away from the gate structure so that dopant atoms are unlikely to migrate into a channel area under the gate structure. The sidewall spacers are formed in a manner that leaves adjacent layers of material substantially uniform so that dopant atom implantation is not adversely affected thereby. The manner of forming the sidewall spacers also allows a salicide blocking process to be simplified. The first sidewall spacers are subsequently reduced in size to establish second sidewall spacers having second widths which are smaller than the first widths. The smaller second sidewall spacers facilitate compliance with design rules by allowing source and drain contacts to be formed closer to the gate structure.

Turning to FIG. 1, a methodology 100 is illustrated for a multi-layer sidewall process according to one or more aspects of the present invention. Although the methodology 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a transistor as illustrated and described below with respect to FIGS. 2–17, as well as to devices not shown or described herein.

Initially, a gate structure or stack is formed over a semiconductor substrate. In particular, a layer of gate dielectric material is formed over the semiconductor substrate at 102, and a layer of gate electrode material is then formed over the layer of dielectric material at 104. The layer of gate electrode is somewhat electrically conductive, and may become more conductive via subsequent doping. Patterning is then performed upon the stack of materials to form the gate structure at 106. The gate structure thus comprises a gate electrode and a gate dielectric. It will be appreciated that the layers can be patterned in any suitable manner to form the gate structure, such as by etching, for example. Further, the layer of gate dielectric material and the gate electrode layer can be applied to the substrate in any number of ways, such as with spin-on techniques, sputtering techniques (e.g., magnetron or ion beam sputtering), growth and/or deposition techniques such as chemical vapor deposition (CVD), for example. The gate dielectric material can be formed to a thickness of about 1 nanometer or more, and can have an equivalent oxide thickness (EOT) of about 1 nanometer or less, for example, while the gate electrode layer can be formed to a thickness of about 50–200 nm, for example.

Additionally, the substrate generally includes silicon (e.g., the substrate, an epitaxial layer, or semiconductor body region overlying an insulator in an SOI wafer), the gate electrode layer generally includes doped polysilicon, SiGe or metal, and the layer of gate dielectric material can comprise a high-k dielectric material, for example. The layer of gate dielectric material may include, for example, any one or more of the following, either alone or in combination: $SiO_2$, aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

A thin layer of an oxide based material, which is at times referred to as poly-ox, is then formed (e.g., grown) over the gate structure and exposed substrate at 108. The poly-ox can be formed to a thickness of between about 30-80 angstroms, for example, depending upon technology and/or process. A thin layer of a nitride based material, known as an offset nitride, is formed over the poly-ox layer at 110. A blanket etch is then performed at 112 so that the offset nitride is substantially removed everywhere except the sidewalls of the gate electrode structure. The blanket etch similarly removes the poly-ox everywhere except the gate electrode sidewalls. Dopant implants (e.g., MDD patterning and implants, PLDD patterning and implants) are then performed at 114 with the offset nitride and poly-ox sidewall spacers serving as a guide for dopant atoms to form preliminary aspects of source and drain regions. By way of example, a p-type dopant having a concentration of about 1E19 to 5E20 atoms/$cm^3$ for a PMOS transistor, or an n-type dopant having concentration of about 1E19 to 9.5E20 atoms/$cm^3$ for an NMOS transistor can be implanted to a depth of about 100–350 Angstroms, for example. It will be appreciated, however, that other implant concentrations and penetration depths are contemplated as falling within the scope of the present invention.

A thin layer of oxide based material, known as a capping oxide, is then formed over the substrate and gate stack at 116. It will be appreciated that the capping oxide is generally deposited (e.g., via chemical vapor deposition (CVD)) since it is difficult to grow an oxide on a nitride, such as the offset nitride. The capping oxide can be formed to between about 50–200 angstroms, for example. After the capping oxide is formed, a thin layer of nitride based material, known as a capping nitride, is formed (e.g., deposited) over the capping oxide at 118. Another thin layer of oxide material, known as a stopping oxide, is then formed over the capping nitride at 120. The capping nitride and stopping oxide layers can be formed to respective thicknesses of between about 50–200 angstroms, for example. A relatively thick layer of nitride material (e.g., between about 600–900 angstroms) is then formed on top of the stopping oxide at 122.

The thick layer of nitride material is then partially etched at 124 to yield first sidewall spacers having respective first widths (e.g., between about 300–500 angstroms) that are relatively wide. The etchant utilized is selective to oxide so that the etching does not proceed past the stopping oxide. A small amount of the stopping oxide may be etched away as the first sidewall spacers are formed, however, creating non-uniformities in the stopping oxide layer that may have undesirable consequences. For example, oxide at or near the center of the wafer may etch differently than at the edge of wafer, and if the center and edge of wafer have different respective oxide thicknesses, for example, source/drain implants may be adversely affected. For example, thinner oxide at the center of the wafer may not inhibit dopant atoms as much as thicker oxide at the perimeter of the wafer. Accordingly, dopants may be implanted more deeply at the center of the wafer. As such, the remaining stopping oxide is removed at 126 according to one or more aspects of the present invention, such as with hydrogen fluoride, for example. Hydrogen fluoride is very selective with respect to nitride such that the underlying capping nitride remains substantially unaffected when the stopping oxide is removed, and the uniformity of the capping nitride is thereby preserved. Similarly, the nitride first sidewall spacers are substantially unaffected when the stopping oxide is removed. It will be appreciated that conventional sidewall formation processes lack the layer of stopping oxide material and the layer of capping nitride material. Accordingly, the layer of capping oxide material would be exposed during processing and made non-uniform thereby. The layer of capping oxide would therefore have to be removed via etching, for example. This could, however, lead to formation of a very narrow channel in an underlying layer of electrically insulative material (e.g., STI between two parallel gate poly lines with sidewalls, which could in turn lead to electrically interconnecting two or more conductive areas, such as source drain contacts, for example, particularly where a conductive material, such as tungsten (W) for example, is subsequently deposited to form contact plugs. Forming sidewall spacers in accordance with one or more aspects of the present invention thus mitigates the opportunity for shorting out conductive areas.

Source/drain doping (and patterning and annealing, etc.) is then performed at 128 in a desired manner as the dopants are be blocked by the sidewall spacers and encounter the substantially uniform capping nitride and capping oxide layers that have a uniform affect upon the implantation process. By way of example, a dopant of Arsenic or other suitable substance having a concentration of about 0.5 to 5E20 atoms/$cm^3$ may be implanted at an energy level of about 30 to 50 KeV to establish source/drain regions to a depth of about 300–350 Angstroms, for example. The uniformity of the capping nitride and capping oxide layers allow dopant atoms to be implanted uniformly such that variations in device characteristics across the wafer are thereby mitigated. It will be appreciated that the presence of the relatively wide first sidewall spacers during the source/drain doping process facilitates locating the implants away from the gate structure a sufficient distance so that these dopants are not likely to diffuse or migrate into a channel area under the gate structure, particularly upon annealing or heat treatments, for example. This mitigates the occurrence of adverse effects associated with dopant atoms within the channel region defined between the source and drain regions, such as skewing respective threshold voltages, increasing leakage currents, etc.

It will be appreciated that salicidation may be performed in subsequent processing in forming conductive layers on certain parts of the wafer. On other parts of the wafer, however, such as where resistors are to be formed, for example, salicidation is not desired so that those portions of the wafer remain non-conductive. Accordingly, after source/drain regions have been developed, optional salicide blocking may be performed at 130 where portions of the wafer that are not to be salicided are covered or masked off so that subsequent etching does not remove the capping nitride and capping oxide layers. In this manner, the capping nitride and capping oxide layers protect those areas from subsequent salicidation so that they remain non-conductive and/or resistive. Thus, forming sidewall spacers in accordance with one or more aspects of the present invention simplifies the salicide blocking process. By way of example, a resistor formed in the absence of salicidation can have a resistance on the order of about 200 ohms/square, whereas that resistance drops to about 10 ohms/square or less with salicidation.

Regardless of whether salicide 'blocking' is performed, the first sidewall spacers are then reduced in size at 132, such as by a dry etching process, for example, to form second sidewall spacers having respective second widths that are narrower than the first widths. The second widths may be on the order of about 200 angstroms or less, for example. It will be appreciated that the capping nitride will also be removed when the sidewall spacers are reduced in size, thereby exposing the capping oxide. A salicidation process is then performed at 134 which reduces the poly and silicon sheet resistance on top of the gate structure and on exposed portions of the substrate (e.g., over the source and drain regions), respectively. Respective contacts that provide electrical access to the source and drain regions, as well as to the gate electrode can then be fashioned at 136, such as by forming electrically conductive plugs (e.g., of tungsten) that are operatively coupled to the salicided areas formed at 134. It can be appreciated that the reduced dimensions of the second sidewall spacers allows the contacts for the source and drain regions to be formed closer to the gate structure which, in turn, facilitates scaling down the transistor. This also allows design rules to be met as scaling occurs, such as maintaining the distance between the gate structure and the source (and/or drain) contact to within a maximum allowable distance, for example. It will be appreciated that plasma etching and/or other cleanup steps that may utilize hydrogen fluoride, for example, during the salicidation process facilitate removal of the remainder of the capping oxide. Further back end processing can then be performed to more fully develop the transistor.

Figure 2:
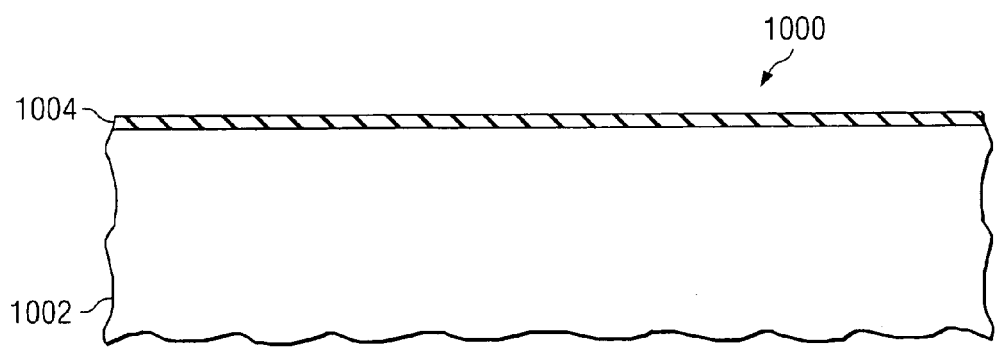
FIGS. 2–17 are cross-sectional illustrations of a transistor formed according to one or more aspects of the present invention.

Turning now to FIGS. 2–17, an exemplary technique for forming a transistor 1000 according to one or more aspects of the present invention is disclosed. Initially, a semiconductor substrate 1002 that is generally composed of silicon has a layer of gate dielectric material 1004 formed thereover (FIG. 2). It is to be appreciated that the term "semiconductor substrate" as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein. The layer of gate dielectric material 1004 can include any of a number of suitable materials. Some examples include silicon dioxide, high-k materials, or a stack of such layers. It will be appreciated that the layer of gate dielectric material 1004 can be formed across the substrate 1002 in any of a number of suitable manners, including, for example, (thermal) growth and/or deposition techniques, such as chemical vapor deposition (CVD).

Figure 3:
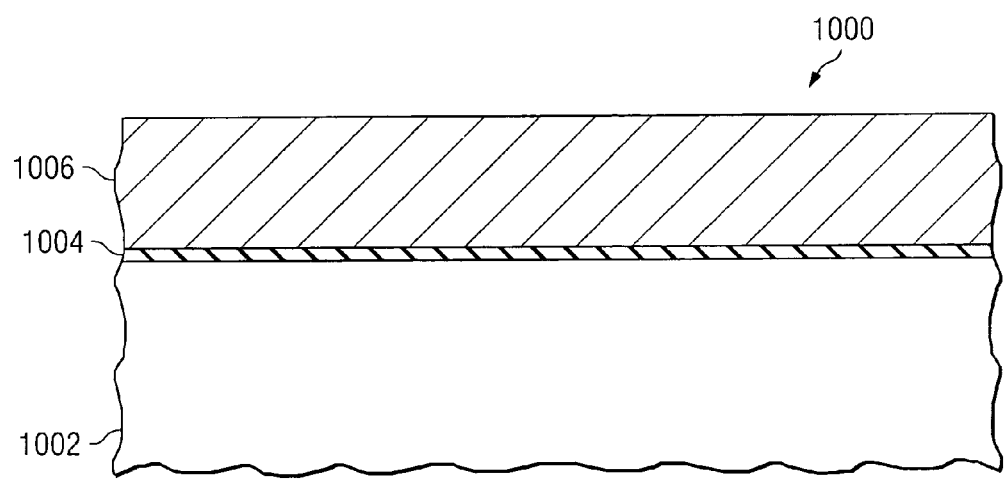
Figure 4:
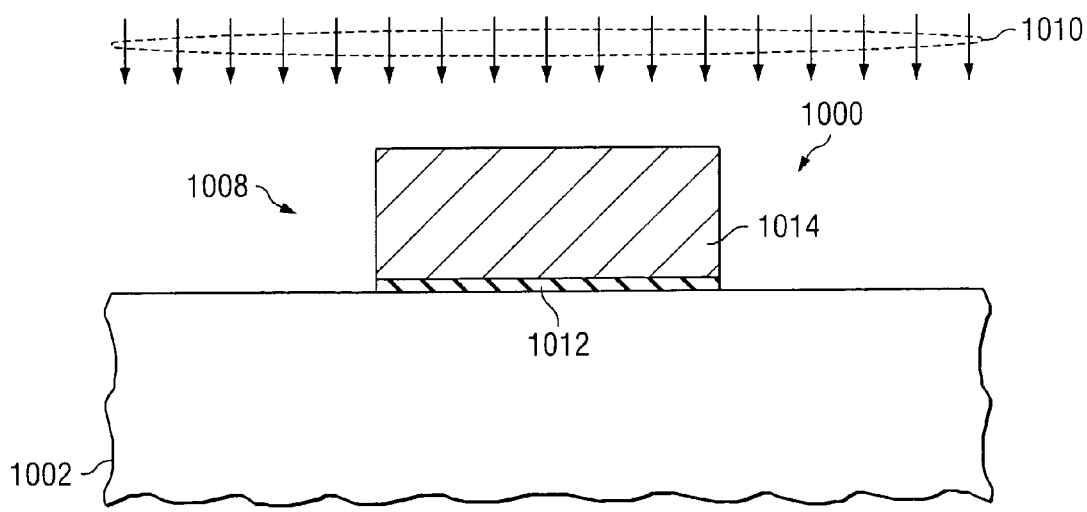

A layer of gate electrode material 1006 is then formed over the layer of gate dielectric material 1004 (e.g., via spin-on, sputtering, deposition, growth techniques, etc.) (FIG. 3). The gate electrode layer 1006 is somewhat electrically conductive and generally includes doped polysilicon, SiGe or metal. The gate electrode layer 1006 ultimately yields a contact area or surface that provides a means for applying a voltage to the transistor 1000 or otherwise biasing the transistor 1000. A gate structure or stack 1008 is then formed by patterning the layer of gate electrode material 1006 (e.g., via an etching process 1010) (FIG. 4). It will be appreciate that the layer of gate dielectric material 1004 is also patterned and removed from the substrate 1002 when the gate electrode layer 1006 is patterned. For example, an etchant utilized to pattern the layer of gate electrode material 1006 also removes some of the gate dielectric material 1004. Similarly, clean up steps associated with patterning the layer of gate electrode material 1006 as well as clean up steps associated with a hard mask removal process also remove some of the gate dielectric material 1004. A gate structure or stack 1008 is thereby formed which comprises a gate dielectric 1012 under a gate electrode 1014.

Figure 5:
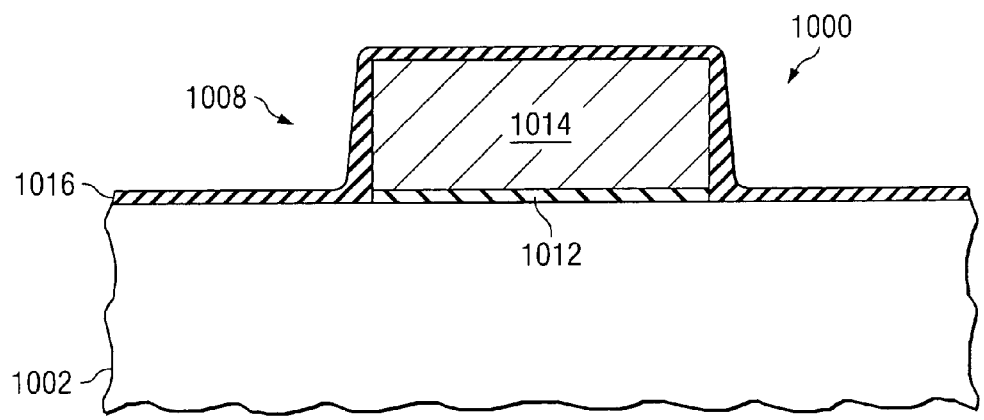
Figure 6:
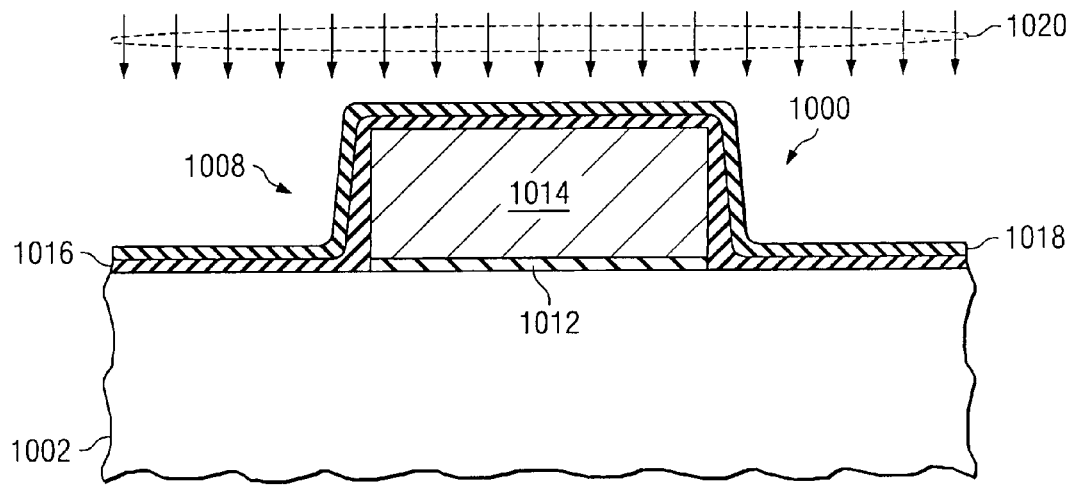
Figure 7:
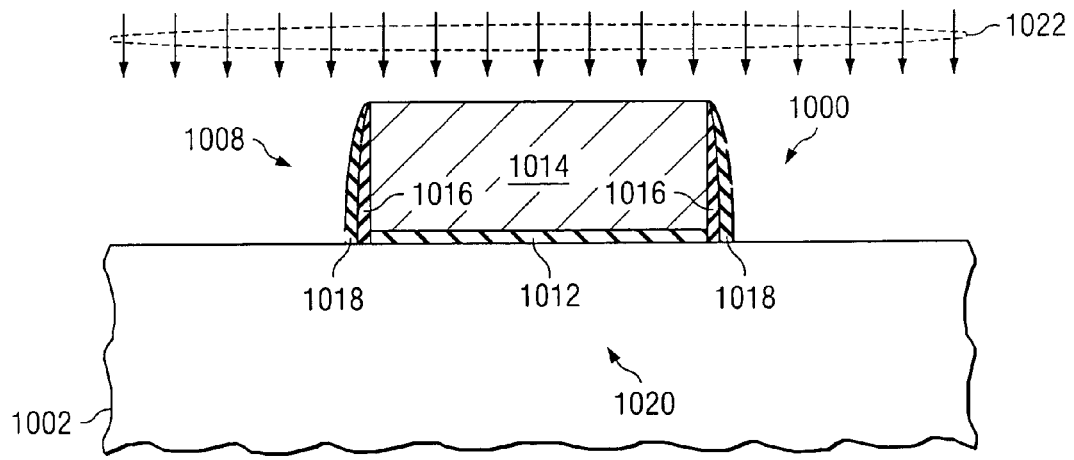
Figure 8:
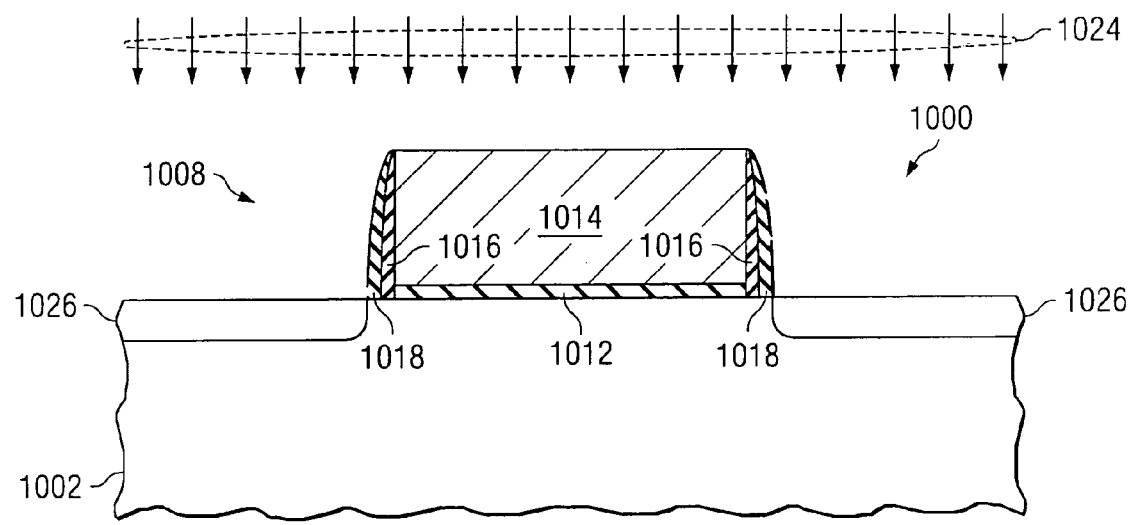

A thin layer of an oxide based material 1016, which is at times referred to as poly-ox, is then formed (e.g., grown) over the gate structure 1008 and exposed substrate 1002 (FIG. 5). The poly-ox 1016 can be formed to a thickness of between about 30–80 angstroms, for example, depending upon technology and/or process. A thin layer of a nitride based material 1018, known as an offset nitride, is formed over the poly-ox layer (e.g., via a deposition process 1020) (FIG. 6). A blanket etching process 1022 is then performed so that the offset nitride 1018 is substantially removed everywhere except the sidewalls of the gate structure 1008 (FIG. 7). The blanket etch 1022 similarly removes the poly-ox 1016 everywhere except the gate sidewalls. A dopant implant process 1024 (e.g., MDD patterning and implants, PLDD patterning and implants) is then performed with the offset nitride and poly-ox sidewall spacers serving as a guide for dopant atoms to form preliminary aspects 1026 of source and drain regions (FIG. 8). By way of example, a p-type dopant having a concentration of about 1E19 to 5E20 atoms/cm$^3$ for a PMOS transistor, or an n-type dopant having concentration of about 1E19 to 9.5E20 atoms/cm$^3$ for an NMOS transistor can be implanted to a depth of about 100–350 Angstroms, for example. It will be appreciated, however, that other implant concentrations and penetration depths are contemplated as falling within the scope of the present invention.

Figure 9:
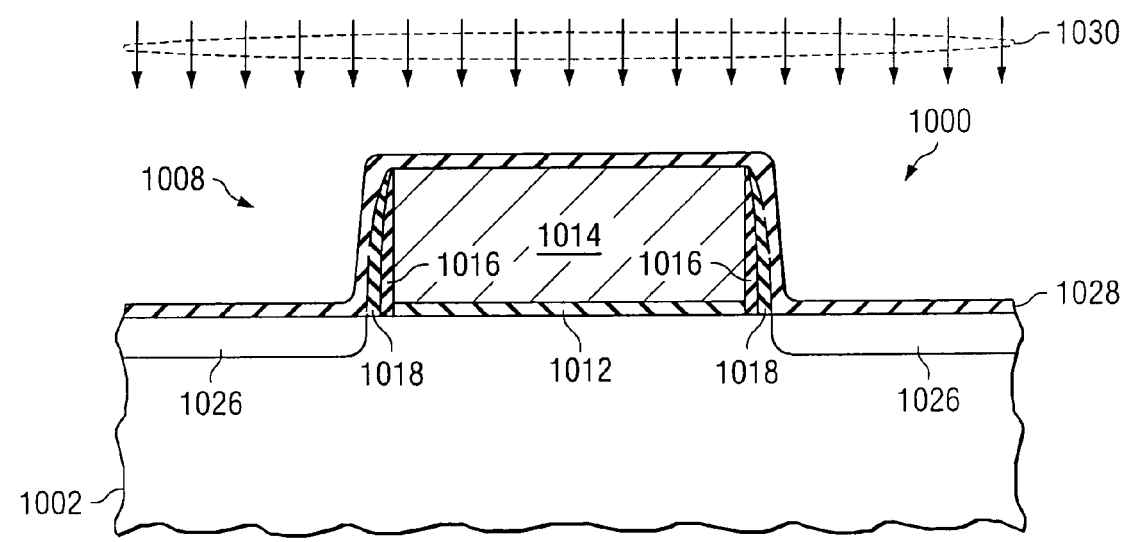
Figure 10:
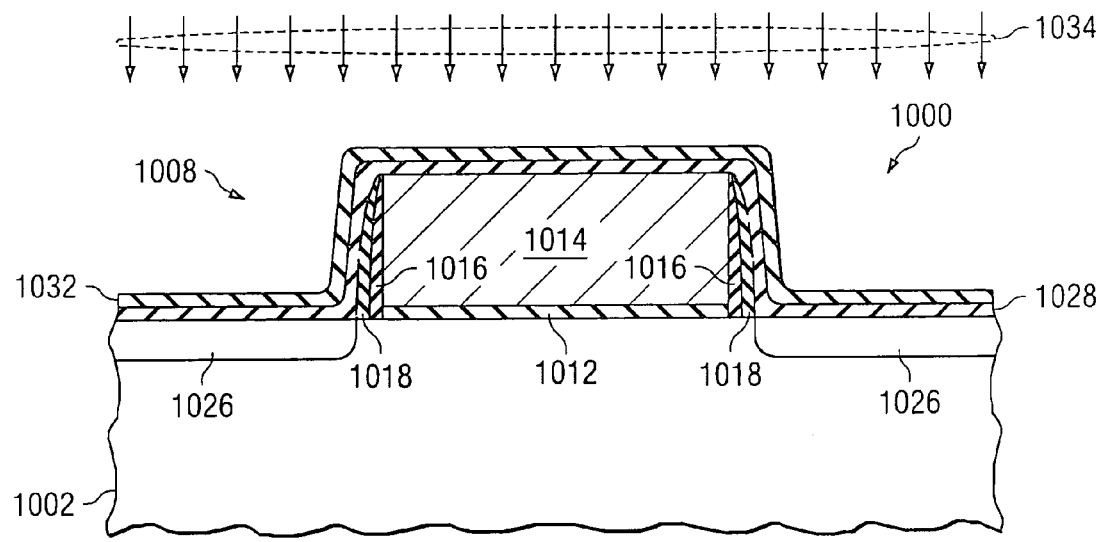
Figure 11:
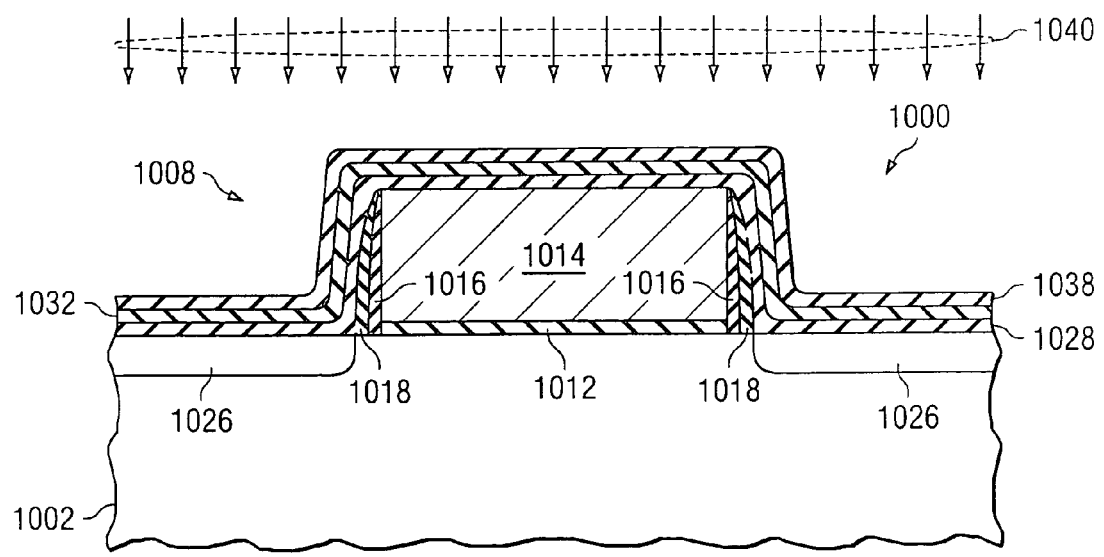

A thin layer of oxide based material 1028, known as a capping oxide, is then formed over the substrate and gate stack at 116 (FIG. 9). It will be appreciated that the capping oxide is generally deposited (e.g., via chemical vapor deposition (CVD) 1030) since it is difficult to grow an oxide on a nitride, such as the offset nitride 1018. The capping oxide 1028 can be formed to between about 50–200 angstroms, for example. After the capping oxide 1028 is formed, a thin layer of nitride based material 1032, known as a capping nitride, is formed (e.g., deposited 1034) over the capping oxide 1028 (FIG. 10). Another thin layer of oxide material 1038, known as a stopping oxide, is then formed over the capping nitride 1032 (e.g., via a deposition process 1040) (FIG. 11). The capping nitride 1032 and stopping oxide 1038 layers can be formed to respective thicknesses of between about 50–200 angstroms, for example.

Figure 12:
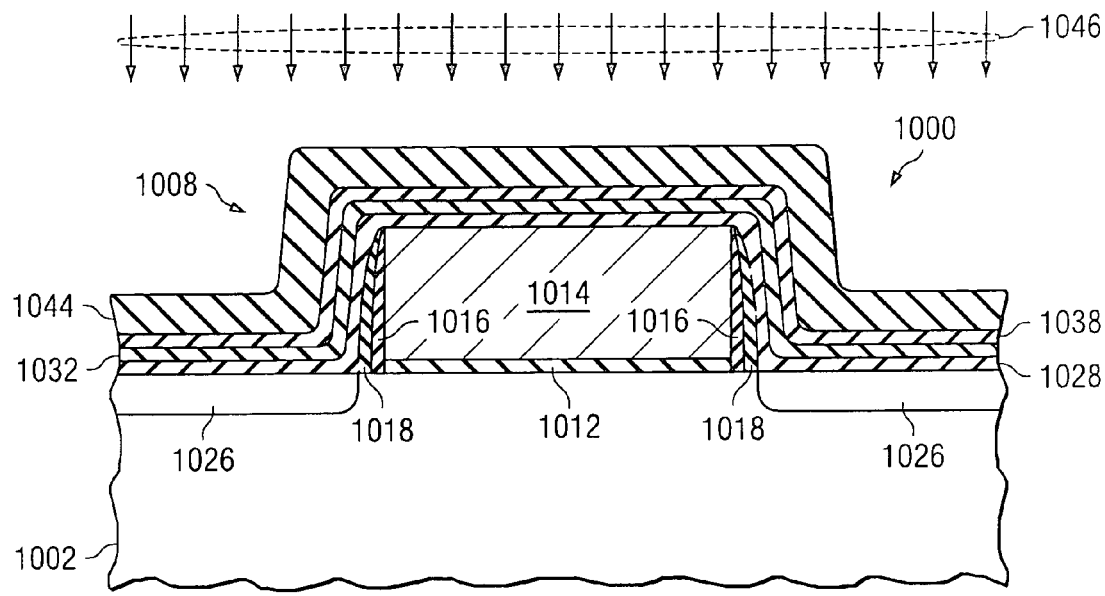
Figure 13:
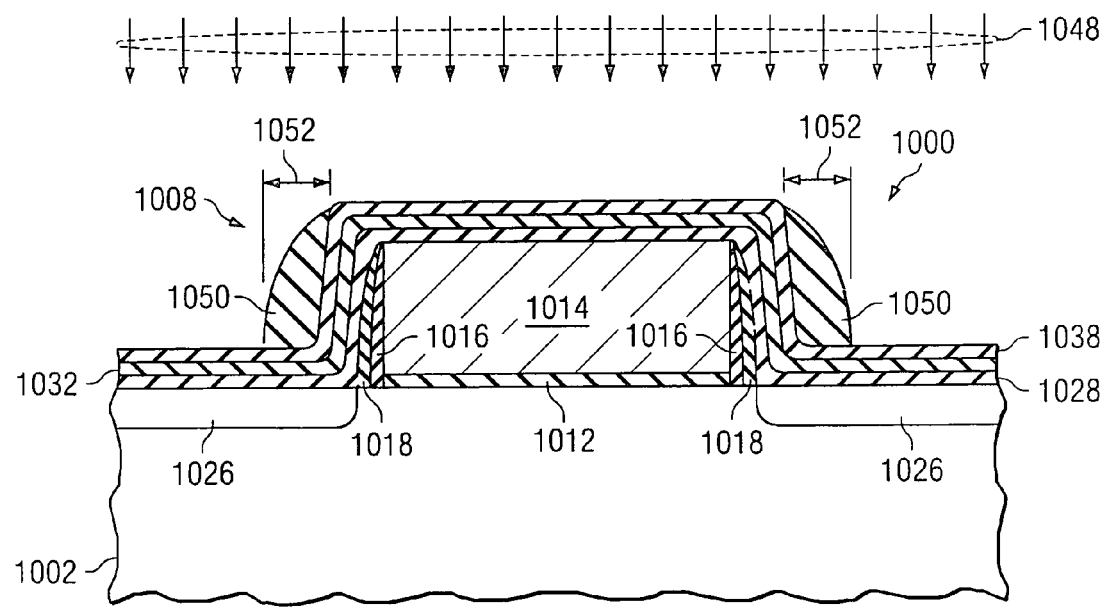
Figure 14:
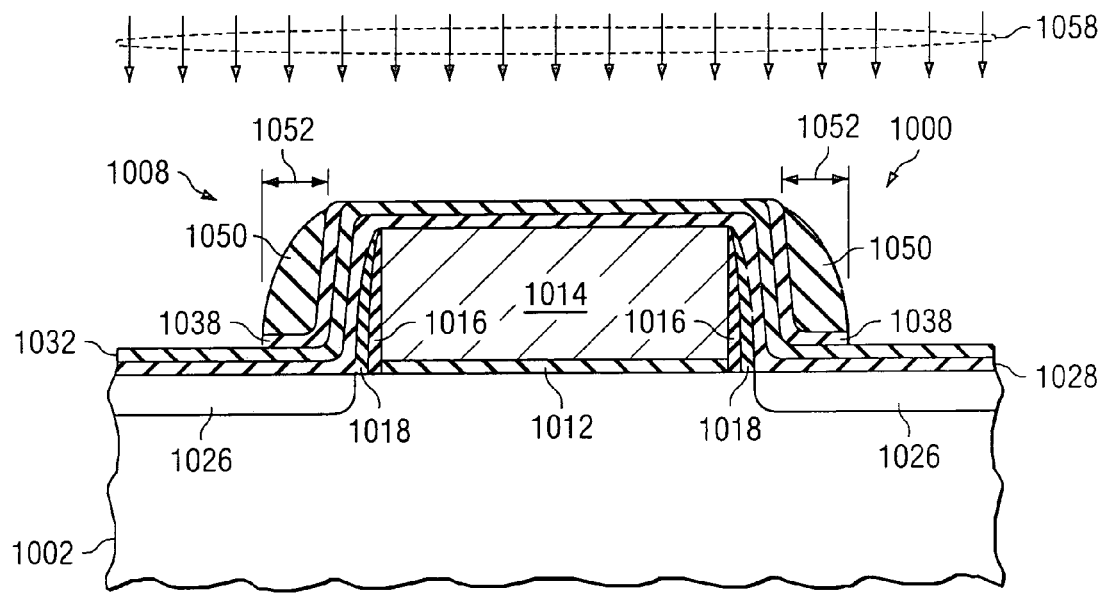

A relatively thick layer of nitride material 1044 (e.g., between about 600–900 angstroms) is then formed on top of the stopping oxide 1038 (e.g., via a deposition process 1046) (FIG. 12). The thick layer of nitride material 1044 is then reduced by a partial etching process 1048 to yield first sidewall spacers 1050 having respective first widths 1052 that are relatively wide (e.g., between about 300–500 angstroms) (FIG. 13). The etchant utilized is selective to oxide so that the etching 1048 does not proceed past the stopping oxide 1038. A small amount of the stopping oxide 1038 may, however, be etched away as the first sidewall spacers 1050 are formed, and any non-uniformity in the stopping oxide layer 1038 may have some undesirable consequences. For example, oxide at or near the center of the wafer 1002 may etch differently than at the edge of wafer, and if the center and edge areas of wafer 1002 have different respective oxide thicknesses, for example, source/drain implants may be adversely affected. For example, thinner oxide at the center of the wafer may not inhibit dopant atoms as much as thicker oxide at the perimeter of the wafer 1002. Accordingly, dopants may be implanted more deeply at the center of the wafer 1002. As such, the remaining stopping oxide 1038 is removed according to one or more aspects of the present invention, such as via hydrogen fluoride application 1058, for example (FIG. 14). Hydrogen fluoride is very selective with respect to nitride such that the underlying capping nitride 1032 remains substantially unaffected when the stopping oxide 1038 is removed, and the uniformity of the capping nitride 1032 is thereby preserved. Similarly, the nitride first sidewall spacers 1050 are substantially unaffected when the stopping oxide 1038 is removed.

Figure 15:
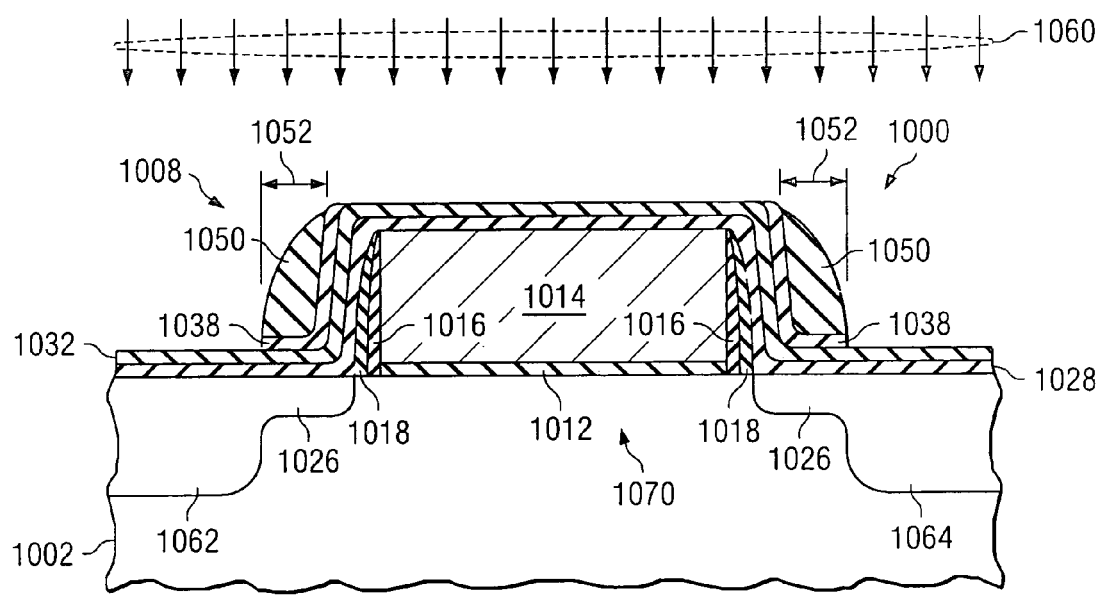

A source/drain doping process 1060 is then performed to form source 1062 and 1064 regions with dopants atoms being blocked by the sidewall spacers 1050 (FIG. 15). By way of example, a dopant of Arsenic or other suitable substance having a concentration of about 0.5 to 5E20 atoms/cm$^3$ may be implanted at an energy level of about 30 to 50 KeV to establish source/drain regions to a depth of about 300–350 Angstroms, for example. The uniformity of the capping nitride 1032 and capping oxide 1028 layers allow dopant atoms to be implanted uniformly such that variations in device characteristics across the wafer are substantially mitigated. It will also be appreciated that the presence of the relatively wide first sidewall spacers 1050 during the source/drain doping process 1060 facilitates locating the implants away from the gate structure 1008 a sufficient distance so that these dopants are not likely to diffuse or migrate into a channel area 1070 under the gate structure 1008, particularly upon annealing or heat treatments, for example. This mitigates the occurrence of adverse effects associated with dopant atoms within the channel region 1070, which is defined between the source 1062 and drain 1064 regions, such as skewing respective threshold voltages, increasing leakage currents, etc.

It will be appreciated that salicidation may be performed in subsequent processing to form conductive layers on certain parts of the wafer 1002. On other parts of the wafer 1002, however, such as where resistors are to be formed, for example, salicidation is not desired so that those portions of the wafer 1002 remain non-conductive. Accordingly, after source/drain regions 1062, 1064 have been developed, optional salicide blocking may be performed (not shown) where portions of the wafer 1002 that are not to be salicided are covered or masked off so that subsequent etching does not remove the capping nitride 1032 and capping oxide 1028 layers. In this manner, the capping nitride 1032 and capping oxide 1028 layers protect those underlying areas of the wafer 1002 from subsequent salicidation so that they remain non-conductive and/or resistive. Thus, forming sidewall spacers in accordance with one or more aspects of the present invention allows the salicide blocking process to be performed in a more efficient manner. By way of example, a resistor formed in the absence of salicidation can have a resistance on the order of about 200 ohms/square, whereas that resistance drops to about 10 ohms/square or less with salicidation.

Figure 16:
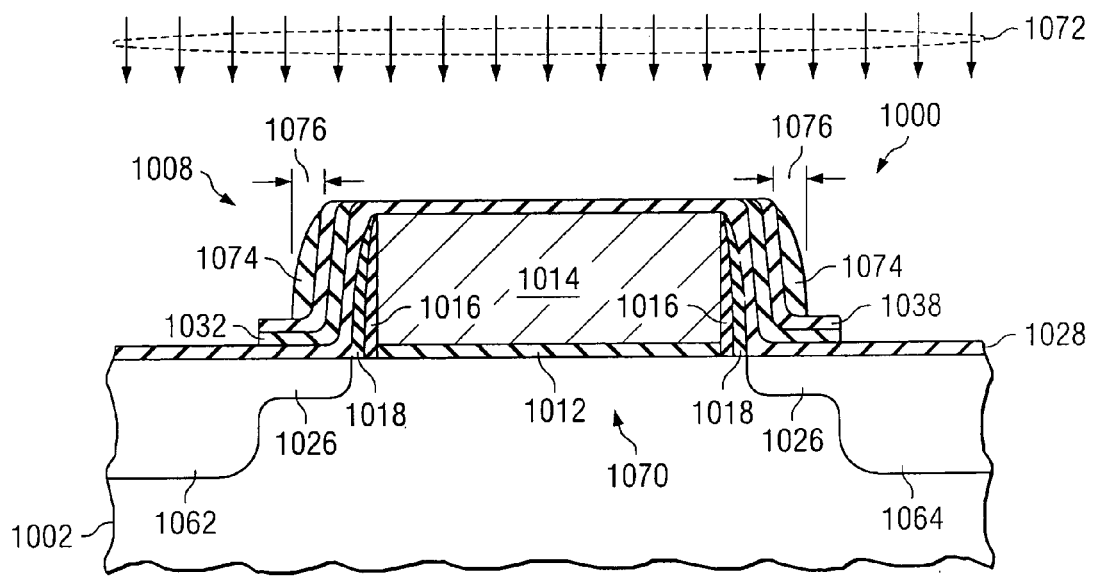
Figure 17:
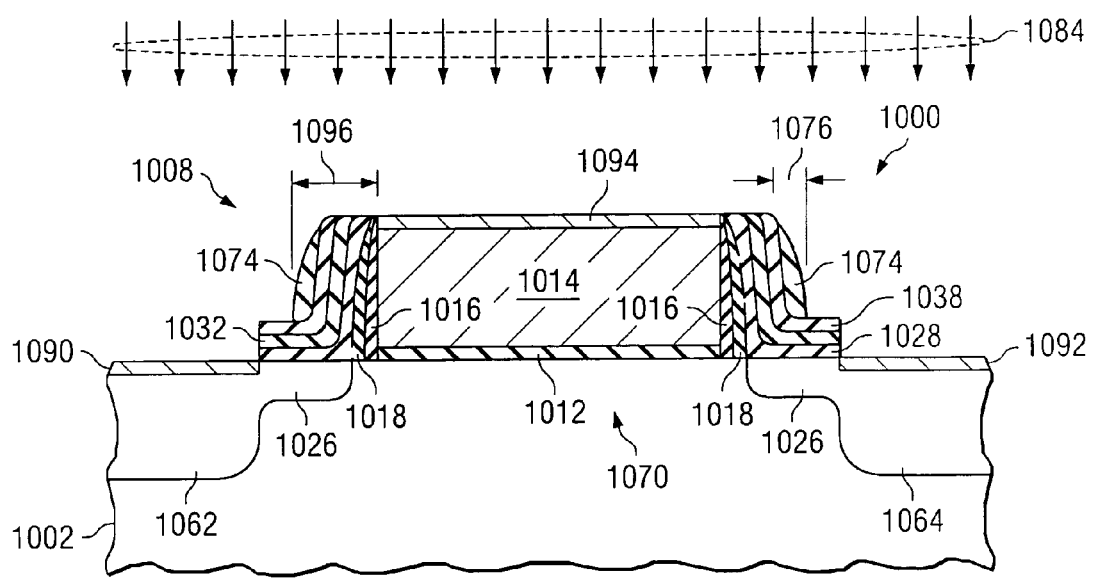

Regardless of whether salicide 'blocking' is performed, the first sidewall spacers 1050 are then reduced in size, such as by a dry etching process 1072, for example, to form second sidewall spacers 1074 having respective second widths 1076 that are narrower than the first widths 1052 (FIG. 16). The second widths may, for example, be about 200 angstroms or less. It will be appreciated that the capping nitride 1032 will also be removed when the sidewall spacers are reduced in size, thereby exposing the capping oxide 1028. A salicidation process 1084 is then performed to form salicided areas or layers 1090, 1092, 1094 on the source 1062, drain 1064 and gate electrode 1014 regions, respectively (FIG. 17). These salicided regions have a reduced resistivity and provide an area or means for electrically accessing the source 1062, drain 1064 and gate electrode 1014 regions (e.g., via subsequently formed conductive contacts or plugs (not shown) that are formed so as to be operatively coupled to the salicided areas). It can be appreciated that the reduced dimensions of the second sidewall spacers 1074 allow the contacts for the source 1062 and drain 1064 regions to be formed closer to the gate structure 1008 which, in turn, facilitates scaling down the transistor 1000. This also allows design rules to be met as scaling occurs, such as by maintaining a distance 1096 between the gate structure 1008 and the source contact to within a maximum allowable distance, for example. It will be appreciated that plasma etching and/or other cleanup steps that may utilize hydrogen fluoride, for example, during the salicidation process 1084 facilitate removal of the remainder of the capping oxide 1028. Further back end processing can then be performed to more fully develop the transistor 1000.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the layers can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. A method of forming a transistor, comprising:
   forming a layer of poly-ox material over a gate structure and portions of a substrate exposed by said gate structure;
   forming a layer of offset nitride material over the poly-ox layer;
   patterning the offset nitride and poly-ox materials such that they remain substantially only on sidewalls of the gate structure;
   forming a layer of capping oxide material over the gate structure of the transistor and said portions of a substrate;
   forming a layer of capping nitride material over the capping oxide;
   forming a layer of stopping oxide material over the capping nitride;
   forming a layer of sidewall material over stopping oxide;
   patterning the layer of sidewall material to form first sidewall spacers adjacent to the gate structure;
   removing the layer of stopping oxide material;
   performing source/drain doping to establish source and drain regions;
   reducing the first sidewall spacers to form second sidewall spacers having respective second widths that are narrower than respective first widths of the first sidewall spacers; and
   forming respective source and drain contacts.

2. The method of claim 1, further comprising:
   forming salicided areas over the source and drain regions, where the layer of capping nitride material is removed during the salicidation process and the source and drain contacts are operatively coupled to the salicided areas.

3. The method of claim 1, further comprising:
   performing preliminary source and drain implants after patterning the offset nitride and poly-ox materials, but before forming the layer of capping oxide material.

4. The method of claim 1, wherein the second widths are about 200 angstroms or less.

5. The method of claim 1, further comprising:
   performing a salicide blocking process after performing source/drain doping implants, but before reducing the first sidewall spacers.

6. The method of claim 1, wherein the first widths are between about 300–500 angstroms.

7. The method of claim 2, wherein hydrogen fluoride is utilized to facilitate removal of at least one of the stopping oxide and the capping oxide.

8. The method of claim 1, wherein the layer of poly-ox material is formed to a thickness of between about 30–80 angstroms.

9. The method of claim 1, wherein the layer of capping oxide material is formed to between about 50–200 angstroms.

10. The method of claim 1, wherein the layer of capping oxide material is deposited.

11. The method of claim 1, wherein at least one of the layer of capping nitride material is formed to a thickness of between about 50–200 angstroms, the layer of stopping oxide material is formed to a thicknesses of between about 50–200 angstroms and the layer of sidewall material is formed to a thickness of between about 600–900 angstroms.

12. The method of claim 1, wherein the first sidewall spacers are reduced by a dry etching process.

13. A method of forming a transistor, comprising:
   forming a layer of gate dielectric material over a semiconductor substrate;
   forming a layer of gate electrode material over the layer of dielectric material;
   patterning gate electrode and gate dielectric layers to form a gate structure;
   forming a layer of poly-ox material over the patterned gate structure and portions of the substrate exposed by said patterned gate structure;
   forming a layer of offset nitride material over the poly-ox layer;
   patterning the offset nitride and poly-ox materials such that they remain substantially only on sidewalls of the gate structure;
   performing preliminary source and drain implants;
   forming a layer of capping oxide material over the gate structure and said portions of the substrate;
   forming a layer of capping nitride material over the capping oxide;
   forming a layer of stopping oxide material over the capping nitride:
   forming a layer of sidewall material over stopping oxide;
   patterning the layer of sidewall material to form first sidewall spacers adjacent to the gate structure;
   removing the layer of stopping oxide material;
   performing source/drain doping to establish source and drain regions;
   performing a salicide blocking process;
   patterning the first sidewall spacers to form second sidewall spacers having respective second widths that are narrower than respective first widths of the first sidewall spacers, wherein the layer of capping nitride material is removed as the second sidewall spacers are formed;
   forming salicided areas over the source and drain regions, wherein the layer of capping oxide material is removed as part of the process that forms the salicided areas; and
   forming respective source and drain contacts that are operatively coupled to the salicided areas.

14. The method of claim 13, wherein the second widths are about 200 angstroms or less.

15. The method of claim 14, wherein at least one of the layer of the layer of poly-ox material is formed to a thickness of between about 30–80 angstroms, the layer of capping oxide material is formed to between about 50–200 angstroms, the layer of capping nitride material is formed to a thickness of between about 50–200 angstroms, the layer of stopping oxide material is formed to a thicknesses of between about 50–200 angstroms and the layer of sidewall material is formed to a thickness of between about 600–900 angstroms.

* * * * *